US009354277B2

(12) United States Patent
Lin et al.

(10) Patent No.: US 9,354,277 B2
(45) Date of Patent: May 31, 2016

(54) APPARATUS OF SOC ESTIMATION DURING PLUG-IN CHARGE MODE

(75) Inventors: Jian Lin, Beverly Hills, MI (US); Xidong Tang, Sterling Heights, MI (US); Brian J. Koch, Berkley, MI (US); Robert C. Baraszu, Dearborn, MI (US); Monika A. Minarcin, River Forest, IL (US); Steven A. Patterson, Oxford, MI (US)

(73) Assignee: GM Global Technology Operatins LLC, Detroit, MI (US)

( * ) Notice: Subject to any disclaimer, the term of this patent is extended or adjusted under 35 U.S.C. 154(b) by 804 days.

(21) Appl. No.: 12/916,262

(22) Filed: Oct. 29, 2010

(65) Prior Publication Data

US 2012/0105013 A1    May 3, 2012

(51) Int. Cl.
*H02J 7/00*     (2006.01)
*H02J 7/04*     (2006.01)
*H02J 7/16*     (2006.01)
*G01R 31/36*    (2006.01)

(52) U.S. Cl.
CPC ........ *G01R 31/3624* (2013.01); *G01R 31/3651* (2013.01); *H02J 7/0021* (2013.01); *Y02T 10/7055* (2013.01)

(58) Field of Classification Search
USPC .......... 320/132, 148, 149, 150; 324/429, 430
See application file for complete search history.

(56) References Cited

U.S. PATENT DOCUMENTS

| | | | | |
|---|---|---|---|---|
| 5,672,951 | A * | 9/1997 | Shiota | 320/132 |
| 5,789,924 | A * | 8/1998 | Okada | G01R 31/361 |
| | | | | 320/106 |
| 6,608,482 | B2 * | 8/2003 | Sakai et al. | 324/426 |
| 6,661,231 | B1 * | 12/2003 | Arai | G01R 31/3624 |
| | | | | 320/132 |
| 7,375,497 | B2 * | 5/2008 | Melichar | 320/132 |
| 7,443,139 | B2 * | 10/2008 | Mitsui et al. | 320/134 |
| 7,453,238 | B2 * | 11/2008 | Melichar | H02J 7/0047 |
| | | | | 320/129 |
| 7,528,575 | B2 * | 5/2009 | Murakami et al. | 320/132 |
| 7,554,297 | B2 * | 6/2009 | Sada et al. | 320/132 |
| 7,768,233 | B2 | 8/2010 | Lin et al. | |
| 7,800,345 | B2 * | 9/2010 | Yun et al. | 320/132 |
| 7,888,912 | B2 * | 2/2011 | Morita et al. | 320/132 |
| 7,928,688 | B2 * | 4/2011 | Nakamura et al. | 320/104 |
| 8,004,243 | B2 * | 8/2011 | Paryani | G01R 31/3624 |
| | | | | 320/132 |
| 8,232,770 | B2 * | 7/2012 | Okumura | 320/132 |
| 8,264,202 | B2 * | 9/2012 | Sahu et al. | 320/132 |
| 2004/0169495 | A1 * | 9/2004 | Yumoto | G01R 31/36 |
| | | | | 320/132 |
| 2007/0262750 | A1 | 11/2007 | Yun | |

(Continued)

*Primary Examiner* — Richard Isla Rodas
*Assistant Examiner* — Michael Dibenedetto
(74) *Attorney, Agent, or Firm* — John A. Miller; Miller IP Group, PLC

(57) ABSTRACT

A system and method for estimating parameters of a rechargeable energy storage system during a plug-in charge mode include reading a first measured voltage and a measured current from the rechargeable energy storage system while charging the rechargeable energy storage system during a plug-in charge mode, interrupting the charge to stop current flow to the rechargeable energy storage system for a predetermined period of time, reading a second measured voltage during the charge interrupt, calculating a resistance based on the first measured voltage, the second measured voltage and the measured current, calculating an open circuit voltage of the rechargeable energy storage system based on the resistance, the second measured voltage, the measured current and determining the state-of-charge for the rechargeable energy storage system using the open circuit voltage.

16 Claims, 2 Drawing Sheets

(56) References Cited

U.S. PATENT DOCUMENTS

| | | | |
|---|---|---|---|
| 2008/0135316 A1* | 6/2008 | Koch | B60L 11/1851 324/427 |
| 2009/0033285 A1* | 2/2009 | Tomura et al. | 320/134 |
| 2009/0195219 A1* | 8/2009 | Morita | B60L 3/0046 320/162 |
| 2009/0259420 A1* | 10/2009 | Greening et al. | 702/63 |
| 2010/0090651 A1 | 4/2010 | Sahu | |
| 2010/0138178 A1 | 6/2010 | Paryani | |

\* cited by examiner

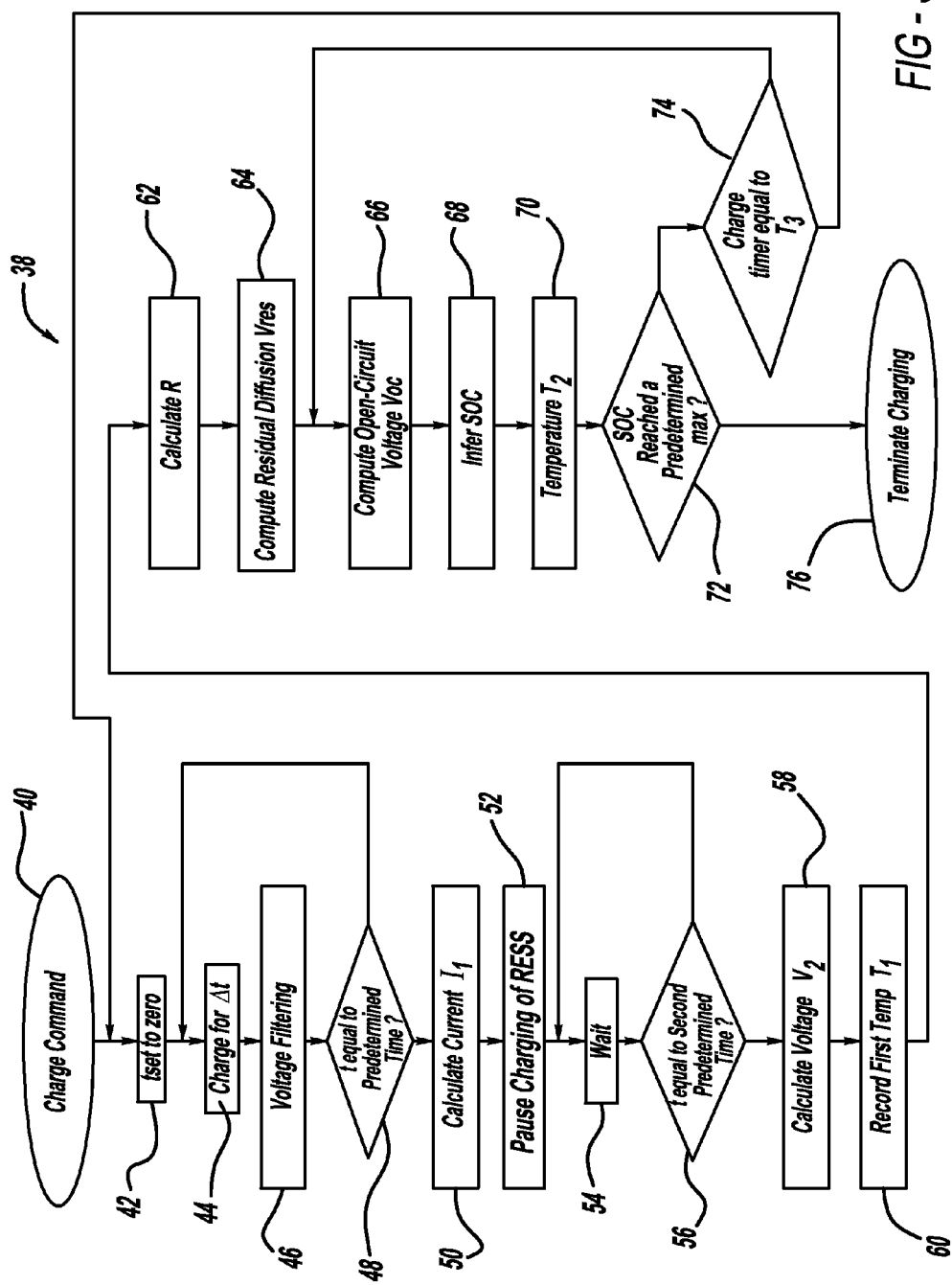

APPARATUS OF SOC ESTIMATION DURING PLUG-IN CHARGE MODE

BACKGROUND OF THE INVENTION

1. Field of the Invention

This invention relates generally to a system and method for estimating a state-of-charge (SOC) for a rechargeable energy storage system (RESS) and, more particularly, to a system and method for accurately estimating the battery SOC during plug-in charge mode.

2. Discussion of the Related Art

Electric-only and hybrid vehicles, such as battery electric vehicles (BEVs), range extended electric vehicles (REEVs), hybrid electric vehicles (HEVs), plug-in hybrid electric vehicles (PHEVs) and fuel cell hybrid electric vehicles (FCHEVs), are becoming increasingly more prevalent. Hybrid vehicles generally combine a rechargeable energy storage system (RESS) with a main power source, such as internal combustible engine or fuel cell system. In one instance, a RESS may be a high voltage battery having a number of battery cells. These cells can be of different chemistries including lithium-ion, lithium-iron, nickel metal hydride, lead acid, etc. A typical high voltage RESS for a BEV, REEV, HEV, PHEV, or FCHEV may include 196 cells providing about 400 volts. Further, the RESS may include individual modules where each module is constructed or made up of a number of interconnected cells. The individual cells may be electrically coupled in series, or a series of cells may be electrically coupled in parallel, where a number of cells in the module are connected in series and each module is electrically coupled to the other modules in parallel. Different vehicle designs include different RESS configurations that employ various trade-offs and advantages for a particular application.

The effectiveness of RESS control and power management is essential to vehicle performance, fuel economy, RESS life and passenger comfort. For RESS control and power management, two states of the RESS, namely, state-of-charge (SOC) and power, need to be predicted, estimated, and monitored in real time because they are not easily measurable during vehicle operation. SOC is a term that refers to the stored charge available to do work relative to that which is available after the RESS has been fully charged. SOC can be viewed as a thermodynamic quantity, enabling one to assess the potential energy of the system. The SOC of the RESS in a vehicle system, such as a BEV, REEV, HEV, PHEV or FCHEV, is important with respect to vehicle efficiency, emissions and power availability. For example, a vehicle operator or an onboard controller might utilize the SOC for the purpose of regulating the operation of the RESS.

One way to estimate SOC is during a plug-in charge mode, where the vehicle is restored to full charge by connecting a plug to an external electrical power source outside the vehicle. However, existing technologies for estimating SOC generally employ non-adaptive IR compensation and require signal excitation to estimate dynamic impedance. For example, it is known to use a current only based SOC estimation technique such as coulomb counting, which depends on a known starting point for an open circuit voltage and initial SOC from the last driving cycle to be correct. The coulomb counting technique can only be used if the starting points are known with absolute certainty, which is difficult because one cannot predict how long the vehicle has been off, driver behavior or how much polarization has occurred in the cells.

Another method for estimation is to employ voltage based SOC calculations such as regression in the form of a recursive least square algorithm. However, these methods require sufficient excitation in the voltage and current signals. During a plug in charge event utilizing constant current, there is too little excitation to allow for algorithms dependant on excitation to calculate SOC with any fidelity. As a result, the voltage-based SOC is not valid most of the time during a plug-in charge.

Therefore, what is desired is a system and method configured to provide accurate and stable information of SOC during a plug-in charge mode to maintain precise charge control to avoid overcharge or undercharge of the RESS when adaptive regression is unable to provide an accurate and stable SOC due to lack of excitation.

SUMMARY OF THE INVENTION

In accordance with the teachings of the present invention, a system and method are disclosed for estimating parameters for a rechargeable energy storage system (RESS). The system and method include reading a first measured voltage and a measured current from the RESS while charging the RESS during a plug-in charge mode, interrupting the charge to stop current flow to the RESS for a predetermined period of time, reading a second measured voltage during the charge interrupt, calculating a resistance based on the first measured voltage, the second measured voltage and the measured current, calculating an open circuit voltage of the RESS based on the resistance, the second measured voltage, the measured current and determining the SOC for the RESS using the open circuit voltage.

Additional features of the present invention will become apparent from the following description and appended claims, taken in conjunction with the accompanying drawings.

BRIEF DESCRIPTION OF THE DRAWINGS

FIG. 3 is a flow chart diagram for an algorithm for estimating state-of-charge during a plug-in charge mode.

DETAILED DESCRIPTION OF THE EMBODIMENTS

The following discussion of the embodiments of the invention directed to a system and method for accurately estimating state-of-charge (SOC) during plug-in mode is merely exemplary in nature, and is in no way intended to limit the invention, its applications or uses. For example, the invention has particular application for an on-board algorithm for in-vehicle applications. However, as will be appreciated by those skilled in the art, the RESS state estimator of the invention will have other applications other than vehicle applications. Moreover, it is understood that that the proposed system and method are applicable to cells, modules, or to an entire pack.

The present invention proposes a system and method for estimating SOC during plug-in charge mode. The system and method include an algorithm for estimating total static resistance and computing open circuit voltage ($V_{oc}$) during plug-in charge mode. The advantages of the proposed algorithm include increasing the life of the RESS and reducing warranty claims by preventing RESS overcharge. In addition, the proposed algorithm increases fuel economy and reduces fuel emissions by avoiding an undercharge condition within the RESS.

The proposed method charges the RESS for a predetermined period of time before measuring the RESS voltage and current. Charging is then paused for a second predetermined period of time. The voltage is measured again and used to estimate a static resistance prior to the pause in charging to resume charging the battery. Using the estimated resistance, the $V_{oc}$ is computed and used to infer the RESS SOC.

Figure 1:
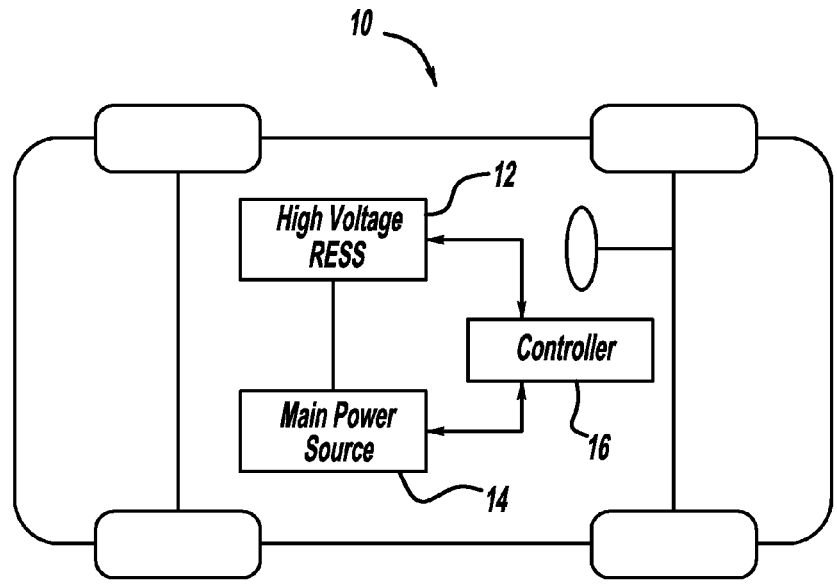
FIG. 1 is a simplified plan view of a plug-in capable hybrid vehicle including a battery and a main power source.

FIG. 1 is a simplified plan view of a vehicle 10 including a high voltage RESS 12 and a main power source 14. The vehicle 10 includes a controller 16 that is intended to represent all of the control modules and devices necessary for the proper operation and control of the power provided by the RESS 12 and the power source 14 to drive the vehicle 10, recharge the RESS 12 by the power source 14 or regenerative braking, and determine the SOC and power capability, as discussed below. In one embodiment, the controller 16 may include a vehicle integration control module having one or more subordinate control modules, such as, but not limited to, a RESS state estimator ring and a RESS plug-in charge control ring. One of ordinary skill in the art understands that the specific configuration of the vehicle 10 shown in FIG. 1 is for purposes of illustration only and is one of many configurations that may be used to implement the algorithm disclosed herein.

Figure 2:
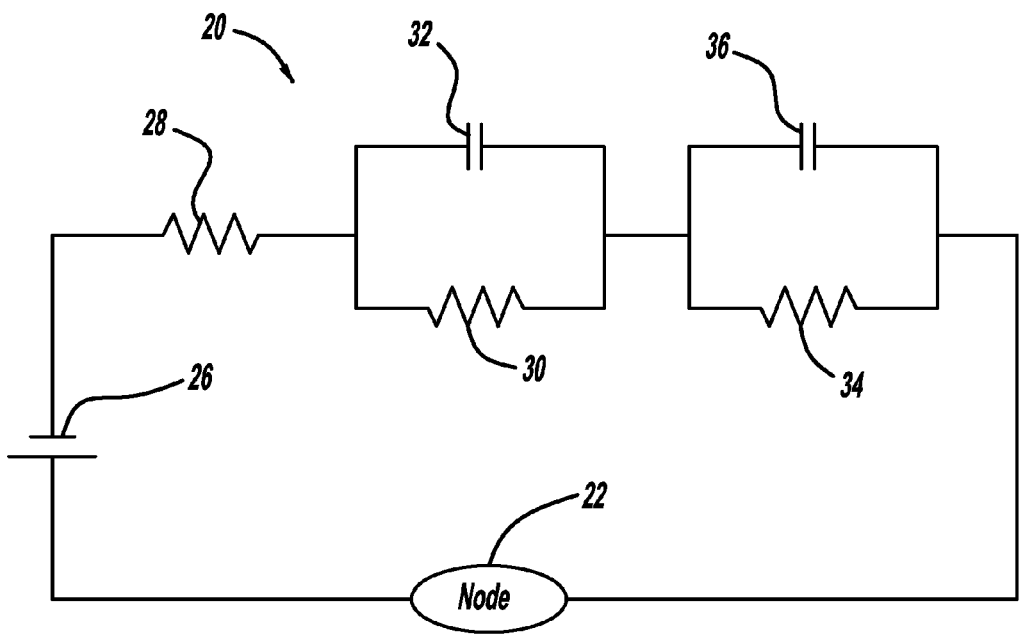
FIG. 2 is a schematic diagram of a two RC-pair equivalent battery circuit.

FIG. 2 is a schematic diagram of a simple two RC-pair equivalent circuit 20 provided as a RESS model. One of ordinary skill in the art understands that the equivalent circuit 20 shown in FIG. 2 is for ease of illustration and that other RESS models employ more complicated equivalent circuits, which may also be used in the discussion below for determining the various values. The circuit 20 includes a potential at node 22 that is the RESS voltage and includes the RESS current. A source 26 represents the RESS open circuit voltage $V_{oc}$ and resistor 28 represents the ohmic resistance R of the circuit 20. A first RC-pair includes capacitor 32 being a double layer (dl) capacitance $C_{dl}$ and a resistor 30 being a charge transfer (ct) resistance $R_{ct}$. A second RC-pair includes resistor 34 being a diffusion resistance $R_{df}$ and a capacitor 36 being a diffusion capacitance $C_{df}$. The RESS model may be characterized by the relationship $$V = V_{oc} + I \times Z \quad (1)$$

where V and I are the measured voltage and current, $V_{oc}$ is the open-circuit voltage, and Z is the battery impedance. When the RESS dynamics saturate during a plug-in charge event, equation (1) is reduced to $$V = V_{oc} + I \times R \quad (2)$$

where R is the total static resistance of the equivalent RESS circuit 20 and where $R = R_{ohm} + R_{ct} + R_{df}$. When R is known, the open-circuit voltage $V_{oc}$ can be obtained by solving equation (2) for $V_{oc}$.

In known systems, R may be obtained using stored values that were estimated by a RESS state estimator during a last driving cycle. This technique, however, requires the use of a look-up table to tune R in terms of temperature. One problem with this approach is that it is difficult to adapt the look-up table to take into account the aging of the RESS. In addition, the look-up table provides no advantage or robustness to the system because the plug-in charge mode and the driving modes are still dependent on one another.

FIG. 3 illustrates an exemplary algorithm 38 for estimating R during a plug-in charge mode according to an embodiment of the present invention. At step 40, if there are no current, voltage or other processing faults, the plug-in charging process begins by sending a charge command to the control module configured to implement the system state estimator algorithms. In one non-limiting embodiment, this control module may be the RESS state estimator ring. At step 42 a charge timer t is set to zero. The algorithm allows unrestricted charging of the RESS for a period of time Δt step 44. The voltage is filtered at step 46 for noise and for voltage characteristics. In one embodiment the filter is based on period of time or counts and is a calibration based filter used to smooth the output. The filter may be a band pass, a low pass, or an averaging filter, or the like, depending on items such as the rate of charge and the voltage sensing ability. In one non-limiting example, the filter is a low pass filter used to calculate the moving average of the voltage.

At step 48, the algorithm determines if the time of charge timer t is equal to a first predetermined time. In one example, this first predetermined period of time is between two and five minutes of charging time. This time period is dependant on items such as the rate of charge, the rate of current change, the temperature, and the chemistry of the cells, etc. During this period of time, the voltage is rising steadily and current is near a steady state charge value. Charging at higher currents generally requires more settling time. If the charger timer t is not equal to the first predetermined period of time, the algorithm returns to step 44 and charging continues. If the charger timer t is equal to the first predetermined period of time, the algorithm calculates at step 50 a pre-interrupt voltage $V_1$, which represents the voltage prior to the intermediate charge termination point or while the vehicle was charging. Voltage $V_1$ is calculated at time t1 based on any number of methods, including, but not limited to, a steady state voltage, a moving average, or any other averaging method or medium that finds a midpoint. The current $I_1$ is also calculated at step 50 and is calculated using any number of methods that determine the steady state or average point of I for a calibration based period of time or counts, and is a calibration based filter. Current $I_1$ represents the constant average current prior to the intermediate charge termination point or while the vehicle was charging.

At step 52, the charging of the RESS is paused to stop the current flow to the RESS. The charging may be paused, for example, by reducing the RESS power limits, by opening contactors, or by employing zero current and voltage limits. At step 54 the algorithm waits for a second period of time $t_2$ until the voltage is settled, which generally is approximately two to five minutes, but may be less. This second period of time is dependent on a variety of factors, including, but not limited to, cell chemistry, temperature, etc., and may also be determined based on a calibration table that correlates the temperature to a settling time. At step 56, the algorithm determines if the time of charge timer t is equal to the second predetermined period of time $t_2$. If the charger timer t is not equal to the second predetermined period of time, the algorithm returns to step 54 and continues to pause the charge. If the charger timer t is equal to the second predetermined period of time, the algorithm calculates at step 58 a post-interrupt voltage $V_2$, which represents the zero current voltage of the RESS. At step 60, a first temperature $T_1$ is measured and recorded. At step 62 the algorithm calculates R according to the following equation.

$$R = (V_1 - V_2)/I \quad (3)$$

At step 64 a residual diffusion voltage $V_{res}$ is computed to compensate for an offset due to a limited time period of rest (i.e., second time period $t_2$). The rest time (t2–t1) may not be long enough to get a stable $V_2$ according to equation (3), especially in low temperature. This is caused by the diffusion effect of the ions in the RESS. Since it is not reasonable to wait a long period of time to get a stable $V_2$, a simple look up table ($V_{res}$ vs. temperature) is used instead to get an approximation of $V_{res}$ to reduce the error.

At step 66, the algorithm computes the open-circuit voltage $V_{oc}$ according to the following equation.

$$V_{oc} = V_2 - I \times R - V_{res} \qquad (4)$$

where $V_2$ is the measured post-interrupt battery terminal voltage. The SOC is inferred from the open-circuit voltage $V_{oc}$ at step 68. SOC and $V_{oc}$ share a relationship that can be mapped through a table using electrochemical knowledge or calculated by various algorithms. Therefore, in one example, SOC is found by using the SOC vs. Voc look up table.

At step 70 a second temperature $T_2$ of the battery is read. At step 72 the algorithm determines if the SOC has reached a predetermined maximum. If the SOC maximum has not been reached (the algorithm continues to use equation (4) to calculate $V_{oc}$), the algorithm determines at step 74 if the charge timer is equal to a periodic time period $T_3$ or if the temperature of the battery, as determined by subtracting the first temperature $T_1$ from the second temperature $T_2$, is equal to or exceeds a temperature threshold $T_{thres}$. The periodic time period $T_3$ ensures that the algorithm is repeated periodically. If either the periodic time period $T_3$ is reached or the temperature threshold $T_{thres}$ has been reached, the algorithm returns to step 44 to repeat the cycle. If neither of the conditions at step 74 are met, the algorithm returns to step 66. If the SOC maximum at step 72 has been reached, the charging process terminates at step 76.

The system described herein may be implemented on one or more suitable computing devices, which generally include applications that may be software applications tangibly embodied as a set of computer-executable instructions on a computer readable medium within the computing device. The computing device may be any one of a number of computing devices, such as a personal computer, processor, handheld computing device, etc.

Computing devices generally each include instructions executable by one or more devices such as those listed above. Computer-executable instructions may be compiled or interpreted from computer programs created using a variety of programming languages and/or technologies, including without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable media includes any medium that participates in providing data (e.g., instructions), which may be read by a computing device such as a computer. Such a medium may take many forms, including, but not limited to, non-volatile media, volatile media, and transmission media. Non-volatile media includes, for example, optical or magnetic disks and other persistent memory. Volatile media include dynamic random access memory (DRAM), which typically constitutes a main memory. Common forms of computer-readable media include any medium from which a computer can read. It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that further developments will occur in the arts discussed herein, and that the disclosed systems and methods will be incorporated into such further examples. In sum, it should be understood that the invention is capable of modification and variation and is limited only by the following claims.

The present embodiments have been particular shown and described, which are merely illustrative of the best modes. It should be understood by those skilled in the art that various alternatives to the embodiments described herein may be employed in practicing the claims without departing from the spirit and scope of the invention and that the method and system within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable construction and their ordinary meaning as understood by those skilled in the art unless an explicit indication to the contrary is made herein. In particular, use of the singular articles such as "a", "the", "said", etc. should be read to recite one or more of the indicated elements unless a claim recites an explicit limitation to the contrary.

What is claimed is:

1. A method for estimating parameters of a rechargeable energy storage system during a plug-in charge mode, said method comprising:
    reading a first measured voltage and a measured current from the rechargeable energy storage system while charging the rechargeable energy storage system during a plug-in charge mode;
    interrupting the charge to stop current flow to the rechargeable energy storage system for a predetermined period of time;
    reading a second measured voltage during the charge interrupt;
    calculating a resistance based on the first measured voltage, the second measured voltage and the measured current;
    calculating an open circuit voltage of the rechargeable energy storage system based on the resistance, the second measured voltage, and the measured current;
    calculating a residual voltage to compensate for an offset due to a limited period of rest relating to the predetermined period of time;
    calculating an open circuit voltage of the rechargeable energy storage system based on the resistance, the second measured voltage, the measured current and the residual voltage; and
    determining the state-of-charge for the rechargeable energy storage system using the open circuit voltage.

2. The method according to claim 1 further including charging the rechargeable energy storage system for an initial predetermined period of time prior to interrupting the charge.

3. The method according to claim 1 wherein the method uses a two RC-pair equivalent rechargeable energy storage system circuit model to estimate the rechargeable energy storage system parameters.

4. The method according to claim 1 wherein the method further includes reading the temperature of the rechargeable energy storage system during the charge interrupt.

5. The method according to claim 1 wherein interrupting the charge includes opening rechargeable energy storage system contactors to pause the charge.

6. The method according to claim 1 wherein interrupting the charge includes limiting current to the rechargeable energy storage system by reducing rechargeable energy storage system power limits.

7. The method according to claim 1 wherein interrupting the charge includes restricting voltage and current limits to the rechargeable energy storage system.

8. The method according to claim 1 wherein determining the state-of-charge includes inferring that state-of-charge from the open-circuit voltage using a look-up table.

9. The method according to claim 1 further including calculating the open circuit voltage until a predetermined periodic time period has been reached or a temperature threshold of the rechargeable energy storage system has been reached.

10. A non-transitory computer-readable storage medium with an executable program stored thereon, wherein the program instructs a controller to estimate parameters of a rechargeable energy storage system during a plug-in charge mode by performing the steps comprising:
    measuring a first voltage and a current of a rechargeable energy storage system during a plug-in charge mode;
    pausing the charge for a predetermined period of time;
    measuring a second voltage during the charge interrupt;
    calculating a resistance based on the first measured voltage, the second measured voltage and the measured current;
    calculating an open circuit voltage based on the resistance and the second voltage;
    calculating a residual voltage to compensate for an offset due to a limited period of rest relating to the predetermined period of time;
    calculating an open circuit voltage of the rechargeable energy storage system based on the resistance, the second measured voltage, the measured current and the residual voltage; and
    determining the state-of-charge using the open circuit voltage.

11. The storage medium according to claim 10 wherein pausing the charge includes reducing the rechargeable energy storage system power limits, opening contactors, or employing zero current and voltage limits.

12. The storage medium according to claim 10 further including reading the temperature of the rechargeable energy storage system during the charge interrupt.

13. The storage medium according to claim 11 further including calculating the open circuit voltage until a predetermined periodic time period has been reached or a temperature threshold has been reached.

14. A system for estimating parameters of a rechargeable energy storage system during a plug-in charge mode, the system comprising a controller being programmed to:
    initiate the plug-in charge mode to charge the rechargeable energy storage system for a first predetermined period of time;
    measure a first voltage and a current of the rechargeable energy storage system during the plug-in charge mode;
    pause the charge for a second predetermined period of time;
    measure a second voltage during the charge interrupt;
    calculate a resistance based on the first measured voltage, the second measured voltage and the measured current;
    calculate an open circuit voltage based on the resistance and the second voltage;
    calculate a residual voltage to compensate for an offset due to a limited period of rest relating to the second predetermined period of time;
    calculate an open circuit voltage of the rechargeable energy storage system based on the resistance, the second measured voltage, the measured current and the residual voltage; and
    determine the state-of-charge using the open circuit voltage.

15. The system according to claim 14 wherein the rechargeable energy storage system is a high voltage battery.

16. The system according to claim 14 wherein pausing the charge includes reducing the rechargeable energy storage system power limits, opening contactors, or employing zero current and voltage limits.

* * * * *